United States Patent [19]
Iida et al.

[11] Patent Number: 6,104,078
[45] Date of Patent: Aug. 15, 2000

[54] DESIGN FOR A SEMICONDUCTOR DEVICE HAVING ELEMENTS ISOLATED BY INSULATING REGIONS

[75] Inventors: Makio Iida, Ichinomiya; Mitsuhiro Saitou, Oobu; Akitaka Murata, Toyohashi; Hiroyuki Ban, Aichi-ken; Tadashi Suzuki, Kariya; Toshio Sakakibara, Nishio; Takayuki Sugisaka, Okazaki; Shoji Miura, Aichi-ken, all of Japan

[73] Assignee: DENSO Corporation, Kariya, Japan

[21] Appl. No.: 08/941,756

[22] Filed: Sep. 30, 1997

Related U.S. Application Data

[63] Continuation of application No. 08/526,421, Sep. 11, 1995, abandoned, which is a continuation-in-part of application No. 08/208,119, Mar. 9, 1994, Pat. No. 5,449,946.

[30] Foreign Application Priority Data

| Sep. 9, 1994 | [JP] | Japan | 6-216428 |
| Sep. 4, 1995 | [JP] | Japan | 7-226496 |

[51] Int. Cl.⁷ ............................................. H01L 29/36
[52] U.S. Cl. .................. 257/524; 257/500; 257/506; 257/526
[58] Field of Search .................... 257/500, 505, 257/506, 508, 684, 728, 524

[56] References Cited

U.S. PATENT DOCUMENTS

| 3,990,102 | 11/1976 | Okuhara et al. . |
| 4,231,056 | 10/1980 | Taylor . |
| 4,470,062 | 9/1984 | Muramaysu . |
| 4,501,060 | 2/1985 | Frye et al. . |
| 4,661,202 | 4/1987 | Ochii . |
| 4,878,957 | 11/1989 | Yamaguchi et al. ................. 257/627 |
| 4,963,505 | 10/1990 | Fujii et al. . |
| 4,998,160 | 3/1991 | Dunn .................................... 257/544 |
| 5,132,806 | 7/1992 | Kitamura et al. ...................... 257/213 |
| 5,241,210 | 8/1993 | Nakagawa et al. . |
| 5,332,920 | 7/1994 | Nakagawa et al. ..................... 257/501 |
| 5,449,946 | 9/1995 | Sakakibara et al. ................... 257/487 |
| 5,592,015 | 1/1997 | Iida et al. ............................. 257/524 |

FOREIGN PATENT DOCUMENTS

| 1017875 | 9/1977 | Canada . |
| 5552851 | 9/1979 | Japan . |
| 60-60753 | 4/1985 | Japan . |
| 61-59852 | 3/1986 | Japan . |
| 63-065641 | 3/1988 | Japan . |
| 3148852 | 6/1991 | Japan . |
| 3276747 | 12/1991 | Japan . |
| 4154147 | 5/1992 | Japan . |
| 4186746 | 7/1992 | Japan . |
| 4239154 | 8/1992 | Japan . |
| 555100 | 3/1993 | Japan . |
| 5144930 | 6/1993 | Japan . |
| 6-268054 | 9/1994 | Japan . |

OTHER PUBLICATIONS

Journal of Nippondenso Technical Disclosure, Mar. 1994, No. 95.

*Primary Examiner*—David Hardy
*Attorney, Agent, or Firm*—Pillsbury Madison & Sutro LLP

[57] ABSTRACT

A semiconductor device including a semiconductor substrate having a main surface. An insulating film is formed on the main surface of the semiconductor substrate. A semiconductor layer is placed on the insulating film. Side insulating regions extending from a surface of the semiconductor layer to the insulating film divide the semiconductor layer into element regions. The element regions are isolated from each other by the side insulating regions and the insulating film. The semiconductor substrate has a resistivity of 1.5 Ωcm or lower. A voltage at the semiconductor substrate is set to a given voltage.

19 Claims, 8 Drawing Sheets

DESIGN FOR A SEMICONDUCTOR DEVICE HAVING ELEMENTS ISOLATED BY INSULATING REGIONS

This is a Continuation of: National Appln. Ser. No. 08/526,421 filed Sep. 11, 1995, now abandoned which is a continuation in part of Ser. No. 08/208,119 filed Mar. 9, 1994, U.S. Pat. No. 5,449,946.

BACKGROUND OF THE INVENTION

1. Field of the Invention

This invention relates to a semiconductor device including a SOI (silicon-on-insulator) substrate on which circuit elements isolated by insulating regions are formed.

2. Description of the Prior Art

Japanese published unexamined patent application 61-59852 discloses a semiconductor device having circuit elements isolated by insulating regions. In Japanese application 61-59852, an insulating film constituting a lower insulating film is formed on a substrate, and a semiconductor layer is superposed on the lower insulating film. The semiconductor layer is divided into element regions between which side insulating regions are formed. The side insulating regions extend vertically from a surface of the semiconductor layer to the lower insulating film. Accordingly, the element regions are completely isolated from each other by the side insulting regions and the lower insulating film. Circuit elements such as transistors are formed in the element regions respectively.

In the semiconductor device of Japanese application 61-59852, noise caused by, for example, a voltage change, tends to be propagated between neighboring circuit elements. The propagation of noise sometimes results in wrong operation of a circuit composed of the elements in the semiconductor device. The lower insulating film and the side insulating regions cause capacitive couplings between neighboring circuit elements. The propagation of noise is enabled by such capacitive couplings.

U.S. Pat. No. 5,241,210 discloses a semiconductor device having elements isolated by insulating regions. In U.S. Pat. No. 5,241,210, an oxide film constituting a lower insulating film is formed on a substrate, and a semiconductor layer is superposed on the lower insulating film. The semiconductor layer is divided into element regions between which side oxide films are formed. The side oxide films extend vertically from a surface of the semiconductor layer to the lower insulating film. Accordingly, the element regions are completely isolated from each other by the side oxide films and the lower insulating film.

Japanese published unexamined utility model application 55-52851 corresponding to Canadian Patent 1017875 discloses a semiconductor integrated circuit having a substrate on which semiconductor element island regions are formed. Circuit elements such as thyristors are provided in the semiconductor element island regions respectively. In Japanese application 55-52851, the semiconductor element island regions are isolated by dielectric films. The substrate has low-resistivity regions made of polycrystalline silicon containing impurity at a high concentration. The low-resistivity regions extend below the dielectric films, so that the semiconductor element island regions are separated from the low-resistivity regions by the dielectric films. The low-resistivity regions also extend between the semiconductor element island regions. To remove capacitive couplings between neighboring semiconductor element island regions, the low-resistivity regions are grounded via an electrode provided on the substrate.

U.S. Pat. No. 4,963,505 discloses a semiconductor device having a lower insulating film formed on a substrate. In the semiconductor device of U.S. Pat. No. 4,963,505, a semiconductor element region extending above the lower insulating film is isolated from adjacent semiconductor element regions by separation regions including side insulating films.

Japanese published unexamined patent application 4-154147 discloses a semiconductor device in which an N epitaxial layer is formed on an N-type Si substrate having a resistivity of 3–10 $\Omega$cm. In the semiconductor device of Japanese application 4-154147, a semiconductor element region extending above the N epitaxial layer is isolated from adjacent semiconductor element regions by lower and side insulating films. Furthermore, electric shielding layers composed of polycrystalline Si films are provided between the semiconductor element regions. A given potential can be applied to the electric shielding layers via electrodes provided on a top of the semiconductor device.

Japanese published unexamined patent application 3-276747 discloses a lead frame in which islands have projections forming stitches. A Vcc potential and a ground potential can be applied via the stitches and internal leads to a semiconductor chip provided on the islands.

JOURNAL OF NIPPONDENSO TECHNICAL DISCLOSURE, published on Mar. 15 in 1994, discloses a semiconductor device in which semiconductor element regions provided on a silicon substrate are isolated from each other by lower and side insulting films. The substrate includes an $N^+$ region subjected to a ground potential.

Japanese published unexamined patent application 4-186746 discloses a semiconductor device in which semiconductor element regions provided on a silicon substrate are Isolated from each other by lower and side insulting films. The substrate includes a laminate of an $N^+$ layer and an $N^-$ layer extending below the semiconductor element regions. The $N^+$ layer has a resistivity of $10^{-4}$–$10^{-2}$ $\Omega$cm. The $N^-$ layer has a resistivity of 1–10 $\Omega$cm.

Japanese published unexamined patent application 5-55100 discloses first and second silicon wafers bonded to form a silicon substrate. The first silicon wafer has an impurity concentration of $1\times10^{14}$–$1\times10^{18}$ cm$^{-3}$. The second silicon wafer has an impurity concentration of $1\times10^{18}$ cm$^{-3}$ or higher.

Japanese published unexamined patent application 5-144930 discloses a semiconductor device in which semiconductor element regions provided on a p-type silicon substrate are isolated from each other by lower and side insulting films. The substrate has an impurity concentration of about $1\times10^{16}$ cm$^{-3}$.

SUMMARY OF THE INVENTION

It is an object of this invention to provide an improved semiconductor device.

A first aspect of this invention provides a semiconductor device comprising a semiconductor substrate having a main surface; an insulating film formed on the main surface of the semiconductor substrate; a semiconductor layer placed on the insulating film; and side insulating regions extending from a surface of the semiconductor layer to the insulating film and dividing the semiconductor layer into element regions, wherein the element regions are isolated from each other by the side insulating regions and the insulating film; wherein the semiconductor substrate has a resistivity of 1.5 $\Omega$cm or lower, and a voltage at the semiconductor substrate is set to a given voltage.

A second aspect of this invention is based on the first aspect thereof, and provides a semiconductor device wherein the resistivity of the semiconductor substrate is equal to 4×10⁻² Ωcm or lower.

A third aspect of this invention provides a semiconductor device comprising a semiconductor substrate having a main surface; an insulating film formed on the main surface of the semiconductor substrate; a semiconductor layer placed on the insulating film; and side insulating regions extending from a surface of the semiconductor layer to the insulating film and dividing the semiconductor layer into element regions, wherein the element regions are isolated from each other by the side insulating regions and the insulating film. The semiconductor substrate has a resistivity of 15 Ωcm or higher, and the semiconductor substrate is in a floating state.

A fourth aspect of this invention is based on the third aspect thereof, and provides a semiconductor device wherein the resistivity of the semiconductor substrate is equal to 1.5×10² Ωcm or higher.

A fifth aspect of this invention is based on the third aspect thereof, and provides a semiconductor device wherein the resistivity of the semiconductor substrate Is equal to 1.5×10³ Ωcm or higher.

A sixth aspect of this invention is based on the first aspect thereof, and provides a semiconductor device wherein the semiconductor substrate and the semiconductor layer are of different conduction types.

A seventh aspect of this invention provides a semiconductor device comprising a semiconductor chip including a composite semiconductor substrate, side insulating films, and island regions. The composite semiconductor substrate includes an element-forming substrate, a supporting substrate, and an insulating layer. The element-forming substrate and the supporting substrate are connected via the insulating layer. The supporting substrate has a resistivity of 1.5 Ωcm or lower. The side insulating films extend from a surface of the element-forming substrate to the insulating layer and divide the element-forming substrate into the island regions, wherein the island regions are isolated from each other by the side insulating films and the insulating layer. The island regions include element-forming island regions formed with circuit elements respectively, the island regions including separating island regions for separating the element-forming island regions from each other. An electrically conductive lead frame includes an island, lead terminals, and a tab lead. The island carries the semiconductor chip, and the lead terminals from the island and are connected to the semiconductor chip via bonding wires. The lead terminals include outer lead portions and inner lead portions, the outer lead portions appearing in an exterior when packaging is completed. The inner lead portions are concealed in a package when packaging is completed. The tab lead is cut and separated from an outer frame when a separate semiconductor device is made, the tab being connected to the island and supporting the island in conjunction with the outer frame. A whole of a surface of the supporting substrate opposite a surface contacting the insulating layer is connected to the island by electrically conductive adhesive. The tab lead is connected to an inner lead portion of an adjacent one of the lead terminals. A bonding wire extending from the separating island region is connected to the one of the lead terminals; and the one of the lead terminals is subjected to a given voltage.

DESCRIPTION OF THE PREFERRED EMBODIMENTS

First Embodiment

Figure 1:
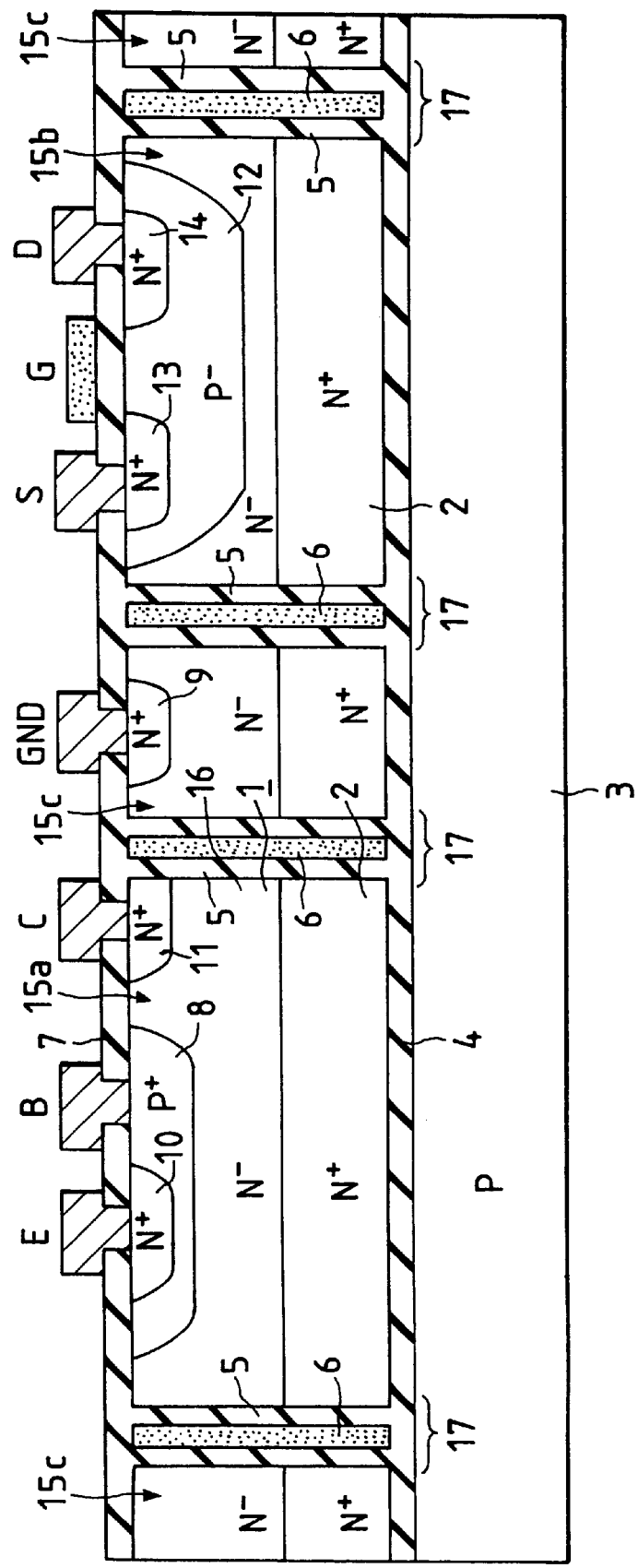
FIG. 1 is a sectional view of a semiconductor device according to a first embodiment of this invention.

With reference to FIG. 1, a semiconductor device includes a P silicon substrate 3 on which a silicon dioxide film 4 extends. The silicon dioxide film 4 has a thickness of 1–2 μm.

Island regions 15a, 15b, and 15c divided by separation regions 17 extend on the silicon dioxide film 4. Each of the separation regions 17 has vertically-extending silicon dioxide films 5 and a vertically-extending polycrystalline silicon region 6 sandwiched between the silicon dioxide films 5. The island regions 15a, 15b, and 15c are isolated from each other by the silicon dioxide films 4 and 5.

Each of the island regions 15a, 15b, and 15c includes a laminate of an N⁺ layer 2 and an N⁻ layer 16. The N⁺ layer 2 extends on the silicon dioxide film 4. The N⁻ layer 16 is superposed on the N⁺ layer 2. The N⁺ layer 2 has a thickness of about 3 μm. The maximum thickness of the N⁻ layer 16 is equal to about 14 μm.

An upper part of the island region 15a has a P⁺ base region 8, an N⁺ emitter region 10, and an N⁺ collector region 11 which adjoin the N⁻ layer 16. The P⁺ base region 8, the N⁺ emitter region 10, and the N⁺ collector region 11 compose a main part of an NPN-type bipolar transistor which constitutes a circuit element.

An upper part of the island region 15b has a P⁻ well region 12, an N⁺ source region 13, and an N⁺ drain region 14 which adjoin the N⁻ layer 16. The P⁻ well region 12, the N⁺ source region 13, and the N⁺ drain region 14 compose a main part of an N-channel MOS transistor which constitutes a circuit element.

An upper part of the island region 15c which extends between the island regions 15a and 15b has an N⁺ contact region 9 adjoining the N⁻ layer 16.

Upper surfaces of the island regions 15a, 15b, and 15c, and also upper surfaces of the separation regions 17 are coated with a field oxide film 7 having contact holes into which electrode wiring lines extend. The electrode wiring lines connect with the P⁺ base region 8, the N⁺ emitter region 10, the N⁺ collector region 11, the N⁺ source region 13, the N⁺ drain region 14, and the N⁺ contact region 9 respectively. The electrode wiring lines are made of, for example, aluminum. In addition, a gate electrode is formed on a given portion of the field oxide film 7 which extends above an area between the N⁺ source region 13 and the N⁺ drain region 14. The electrode wiring lines are coated with protective films (not shown).

It should be noted that, in FIG. 1, the characters E, B, C, S, D, G, and GND denote an emitter, a base, a collector, a source, a drain, a gate, and a ground respectively.

During operation of the semiconductor device of FIG. 1, the island region 15c which extends between the island regions 15a and 15b is generally subjected to a ground potential. Accordingly, the island region 15c serves as an electrical shield between the circuit elements in the island regions 15a and 15b. In other words, the island region 15c serves to prevent the occurrence of a capacitive coupling between the circuit elements in the island regions 15a and 15b.

The semiconductor device of FIG. 1 has a suitable electrode (not shown) which enables the application of a given potential such as a ground potential to the P silicon substrate 3. In the case where the P silicon substrate 3 is subjected to a ground potential during the operation of the semiconductor device, the P silicon substrate 3 helps the prevention of the occurrence of the capacitive coupling between the circuit elements in the island regions 15a and 15b.

It should be noted that the P silicon substrate 3 may be replaced by an N silicon substrate. Generally, it is preferable to use the P silicon substrate 3 rather than the N silicon substrate.

Figure 2:
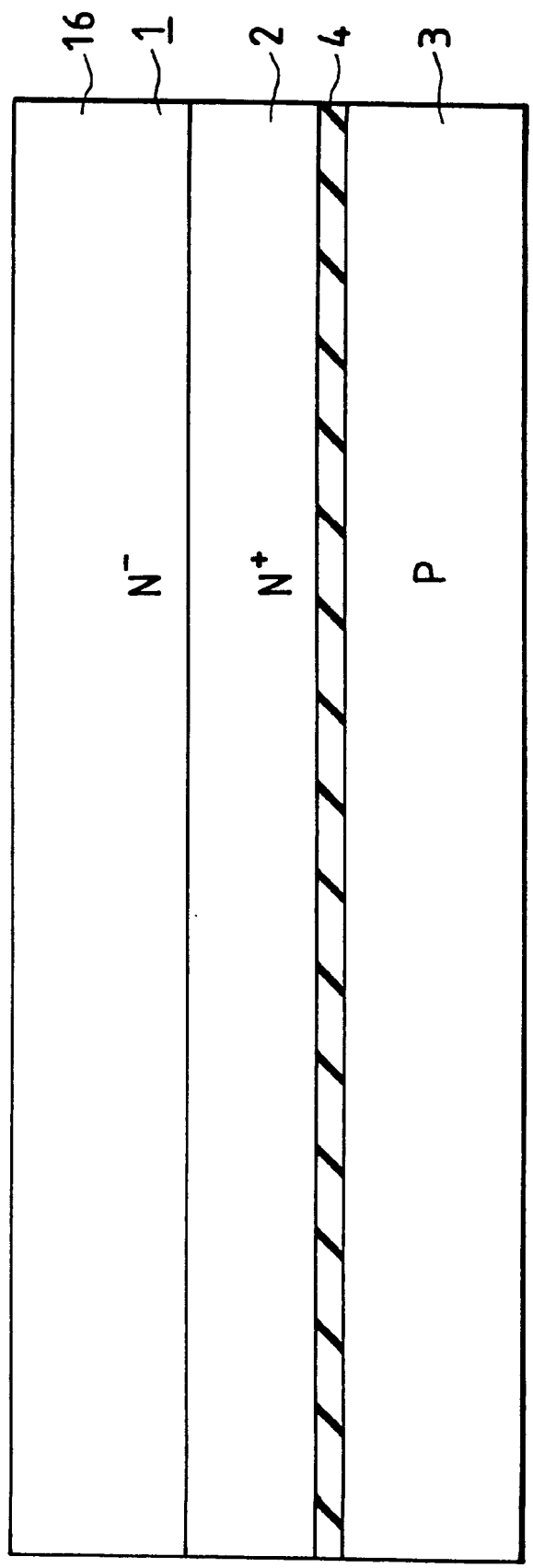
FIGS. 2, 3, and 4 are sectional views of a substrate and layers thereon which occur at different stages of the fabrication of the semiconductor device in FIG. 1.

The semiconductor device of FIG. 1 is fabricated as follows. With reference to FIG. 2, main surfaces of an N⁻ silicon substrate 1 are polished into mirror surfaces. N-type impurities such as antimony (Sb) are diffused into the N⁻ silicon substrate 1 via its one main surface by a depth of about 3 μm to form an N⁺ layer 2 on the N⁻ silicon substrate 1. This diffusion is executed by a vapor diffusion process.

One of main surfaces of a P silicon substrate 3 is polished into a mirror surface. The mirror main surface of the P silicon substrate 3 is subjected to a thermally oxidizing process so that a silicon 5 dioxide film 4 is formed on the P silicon substrate 3. The silicon dioxide film 4 has a thickness of 1–2 μm.

The silicon substrates 1 and 3 are brought into contact with each other in a manner such that the N⁺ layer 2 and the silicon dioxide film 4 adjoin each other as shown in FIG. 2. The silicon substrates 1 and 3 are placed in a clean atmosphere, being heated at a temperature of about 1,100° C. and being thereby bonded together. Each of the silicon substrates 1 and 3 has a thickness of about 500 μm.

In the case where the silicon substrate 3 is subjected to a ground potential (a ground voltage) during operation of the semiconductor device, the impurity concentration of the silicon substrate 3 is preferably equal to $1 \times 10^{16}$ cm⁻³ or higher, and is most preferably equal to $1 \times 10^{18}$ cm⁻³ or higher. Since the silicon dioxide film 4 is made by thermal oxidization of a surface portion of the silicon substrate 3 as previously described, a large number of P-type impurities tend to be held in the silicon dioxide film 4 if the impurity concentration of the silicon substrate 3 is excessively high. Such a large number of P-type impurities in the silicon dioxide film 4 causes a considerable reduction in quality of the silicon dioxide film 4. To prevent the quality reduction, the impurity concentration of the silicon substrate 3 is preferably equal to about $1 \times 10^{20}$ cm⁻³ or lower.

In the case where the silicon substrate 3 is kept in a floating state during operation of the semiconductor device, the impurity concentration of the silicon substrate 3 is preferably equal to $1 \times 10^{15}$ cm⁻³ or lower, and is more preferably equal to $1 \times 10^{14}$ cm⁻³ or lower. Further, the impurity concentration of the silicon substrate 3 is most preferably equal to $1 \times 10^{13}$ cm⁻³ or lower.

By referring to a known relation between an impurity concentration and a resistivity (a specific resistance), ranges of the resistivity of the silicon substrate 3 are determined as follows. In the case where the silicon substrate 3 is subjected to a ground potential (a ground voltage) during operation of the semiconductor device, the resistivity of the silicon substrate 3 is preferably equal to 1.5 Ωcm or lower, and is most preferably equal to $4 \times 10^{-2}$ Ωcm or lower. In the case where the silicon substrate 3 is kept in a floating state during operation of the semiconductor device, the resistivity of the silicon substrate 3 is preferably equal to 15 Ωcm or higher, and is more preferably equal to $1.5 \times 10^2$ Ωcm or higher. Further, the resistivity of the silicon substrate 3 is most preferably equal to $1.5 \times 10^3$ Ωcm or higher.

After the silicon substrates 1 and 3 are bonded together, the silicon substrate 1 is polished so that its thickness is reduced to about 17 μm. At this time, the N⁺ layer 2 having a thickness of about 3 μm and an N⁻ layer 16 having a thickness of about 14 μm are sequentially superposed on the silicon dioxide film 4 as shown in FIG. 2. The P silicon substrate 3, the silicon dioxide film 4, the N⁺ layer 2, and the N⁻ layer 16 compose a SOI (silicon-on-insulator) substrate. The thicknesses of the N⁺ layer 2 and the N⁻ layer 16 may differ from the previously-indicated values.

Figure 3:
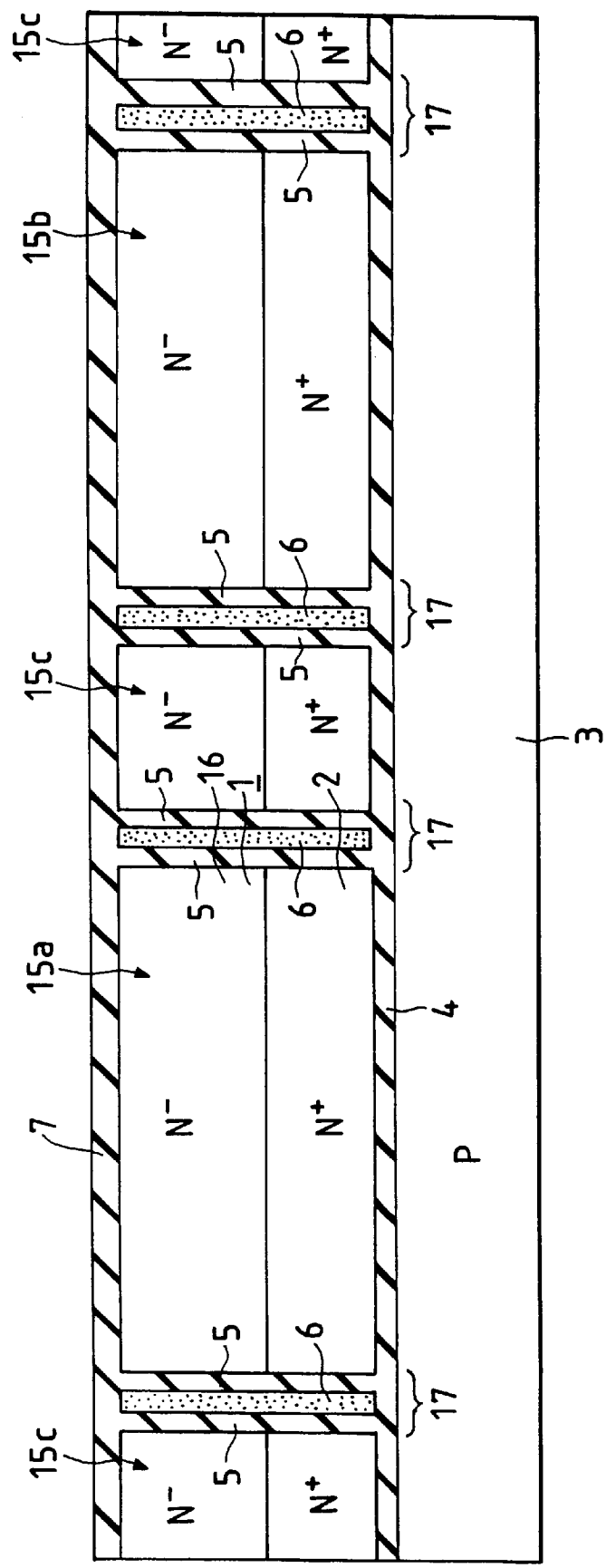

Subsequently, as shown in FIG. 3, trench regions (separation regions) 17 are formed in the SOI substrate. The trench regions 17 vertically extend from an upper main surface of the SOI substrate to the silicon dioxide film 4. As a result, island regions 15a, 15b, and 15c divided by the trench regions 17 are provided in the SOI substrate. Specifically, a mask film including an oxide film and/or a silicon nitride film is formed on the upper main surface of the SOI substrate after the SOI substrate is made. Portions of the mask film are removed by a selective etching process. Therefore, the upper main surface of the SOI substrate is formed with recesses at which the N⁻ layer 16 is exposed. Portions of the SOI substrate which vertically align with the recesses are removed by an etching process so that vertically-extending isolation grooves are formed in the SOI substrate. Silicon dioxide films 5 are formed on surfaces of substrate walls which define the isolation grooves. Then, the isolation grooves are filled with polycrystalline silicon, and thus polycrystalline silicon regions 6 are formed. Polycrystalline silicon deposited on the mask film is removed by an etching process (etching back). Subsequently, the mask film is removed by, for example, an etching process. Then, an exposed upper surface portion of the SOI substrate is oxidized to form an oxide film (a field oxide film or a silicon dioxide film) 7 on the SOI substrate. The oxide film 7 is of, for example, the LOCOS (local oxidation of silicon) type. The island regions 15a, 15b, and 15c are electrically isolated from each other by the silicon dioxide films 4 and 5. The island regions 15a and 15b will be used for making circuit elements while the island regions 15c will be used to prevent the occurrence of capacitive couplings between the circuit elements in the island regions 15a and 15b.

Figure 4:
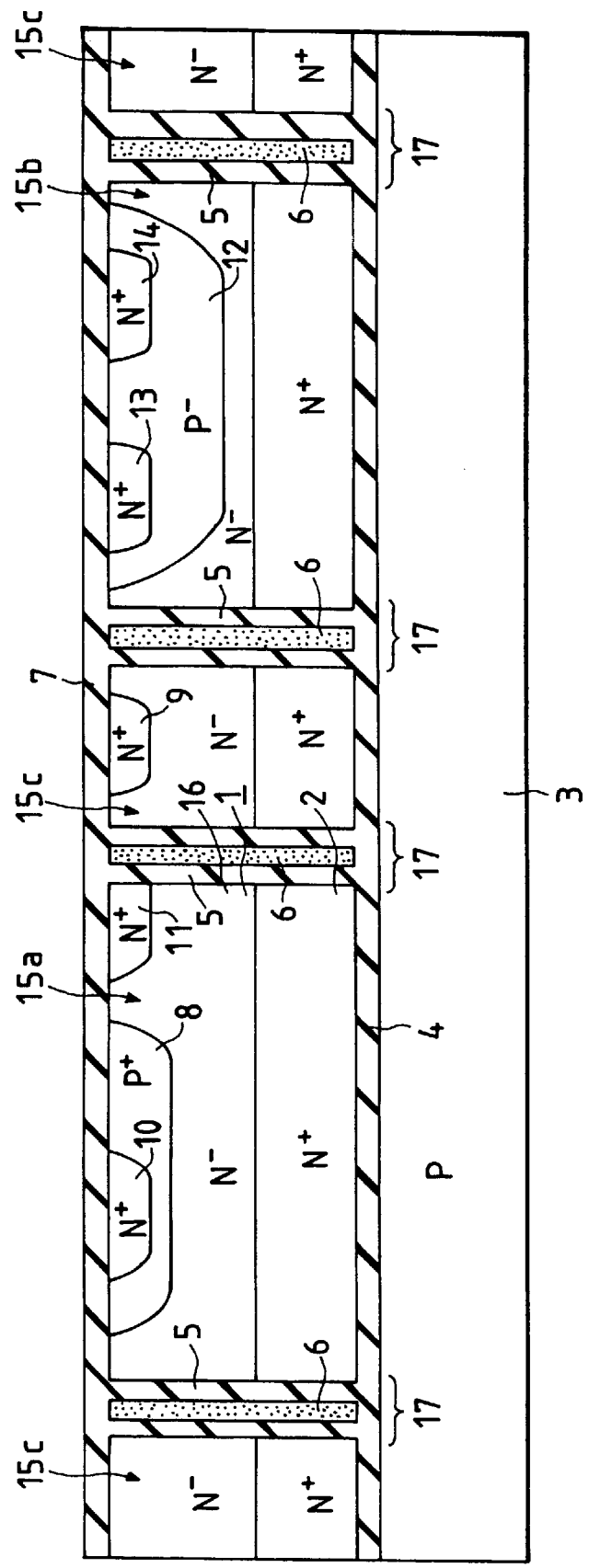

Then, as shown in FIG. 4, diffused regions are formed in the island regions 15a and 15b for making circuit elements. Specifically, a P⁺ base region 8, an N⁺ emitter region 10, and an N⁺ collector region 11 are formed in the island region 15a by known processes such as photolithography, ion implantation, and diffusion. The P⁺ base region 8, the N⁺ emitter region 10, and the N⁺ collector region 11 compose a main part of an NPN-type bipolar transistor which constitutes a circuit element. A P⁻ well region 12, an N⁺ source region 13, and an N⁺ drain region 14 are formed in the island region 15b by similar processes. The P⁻ well region 12, the N⁺ source region 13, and the N⁺ drain region 14 compose a main part of an N-channel MOS transistor which constitutes a circuit element. The island region 15c extending between the island regions 15a and 15b will be used to prevent the occurrence of a capacitive coupling between the circuit elements in the island regions 15a and 15b. An N$^+$ contact region 9 is formed in the island region 15c by similar processes. The N$^+$ contact region 9 will be used to provide connection with an electrode wiring line.

Subsequently, contact holes are provided through the field oxide film 7. Electrode wiring lines extending into the contact holes are formed on the upper main surface of the SOI substrate. The electrode wiring lines connect with the P$^+$ base region 8, the N$^+$ emitter region 10, the N$^+$ collector region 11, the N$^+$ source region 13, the N$^+$ drain region 14, and the N$^+$ contact region 9 respectively. The electrode wiring lines are made of, for example, aluminum. In addition, a gate electrode is formed on a given portion of the field oxide film 7 which extends above an area between the N$^+$ source region 13 and the N$^+$ drain region 14. The electrode wiring lines are coated with protective films. As a result, the semiconductor device of FIG. 1 is completed.

In the semiconductor device of FIG. 1, since the transistors are completely isolated from the P silicon substrate 3 by the silicon dioxide film 4, the P silicon substrate 3 may be replaced by an N silicon substrate. In the case where the silicon substrate 3 is of the P type, even if substrate bonding portions have defects such as pinholes, PN junctions occur so that no current flows therethrough. Accordingly, it is preferable to use the P silicon substrate 3 rather than the N silicon substrate. Thus, it is preferable that semiconductor layers extending along opposite sides of the silicon dioxide film 4 are of the different conduction types respectively.

It should be noted that the NPN-type bipolar transistor and the N-channel MOS transistor in the island regions 15a and 15b may be replaced by other circuit elements.

The island regions 15c may be omitted. In this case, it is preferable to apply a given potential or a ground potential to the polycrystalline silicon regions 6 in the separation regions 17.

Second Embodiment

Figure 5:
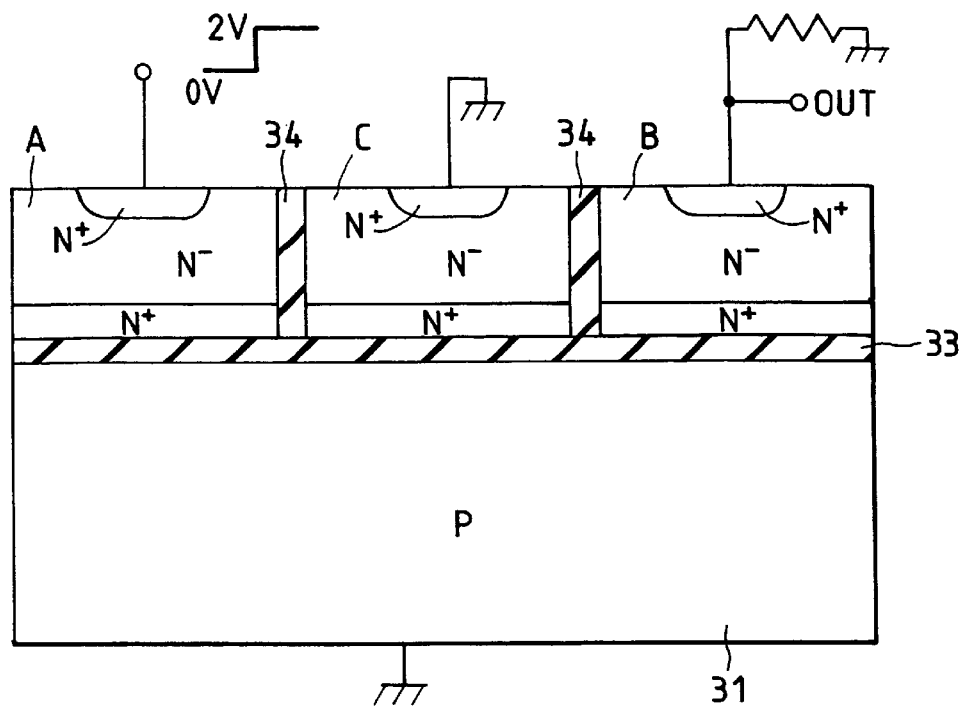
FIG. 5 is a sectional diagram of a semiconductor device according to a second embodiment of this invention.

FIG. 5 shows a semiconductor device basically similar to the semiconductor device of FIG. 1. The semiconductor device of FIG. 5 includes a P silicon substrate 31 on which a silicon dioxide film 33 extends. The P silicon substrate 31 and the silicon dioxide film 33 correspond to the P silicon substrate 3 and the silicon dioxide film 4 of FIG. 1 respectively.

In the semiconductor device of FIG. 5, island regions A, B, and C divided by trench regions (separation regions) 34 extend on the silicon dioxide film 33. The island regions A, B, and C are isolated from each other by the silicon dioxide film 33 and the trench regions 34. The island regions A, B, and C correspond to the island regions 15a, 15b, and 15c of FIG. 1 respectively. The trench regions 34 correspond to the separation regions 17 of FIG. 1.

During operation of the semiconductor device of FIG. 5, the island region C and the P silicon substrate 31 are grounded. In other words, the island region C and the P silicon substrate 31 are subjected to a ground potential.

Experiments were carried out as follows. Samples of the semiconductor device of FIG. 5 were prepared in which the P silicon substrates 31 had different impurity concentrations respectively. Regarding each of the samples, the island region C and the P silicon substrate 31 continued to be subjected to a ground potential. In addition, an input voltage of 2 V was applied to the island region A. Regarding each of the samples, measurement was given of an output voltage which was induced at the island region B in response to the input voltage. Thus, measurement was given of the degree of the propagation of a voltage signal from the island region A to the island region B.

Figure 6:
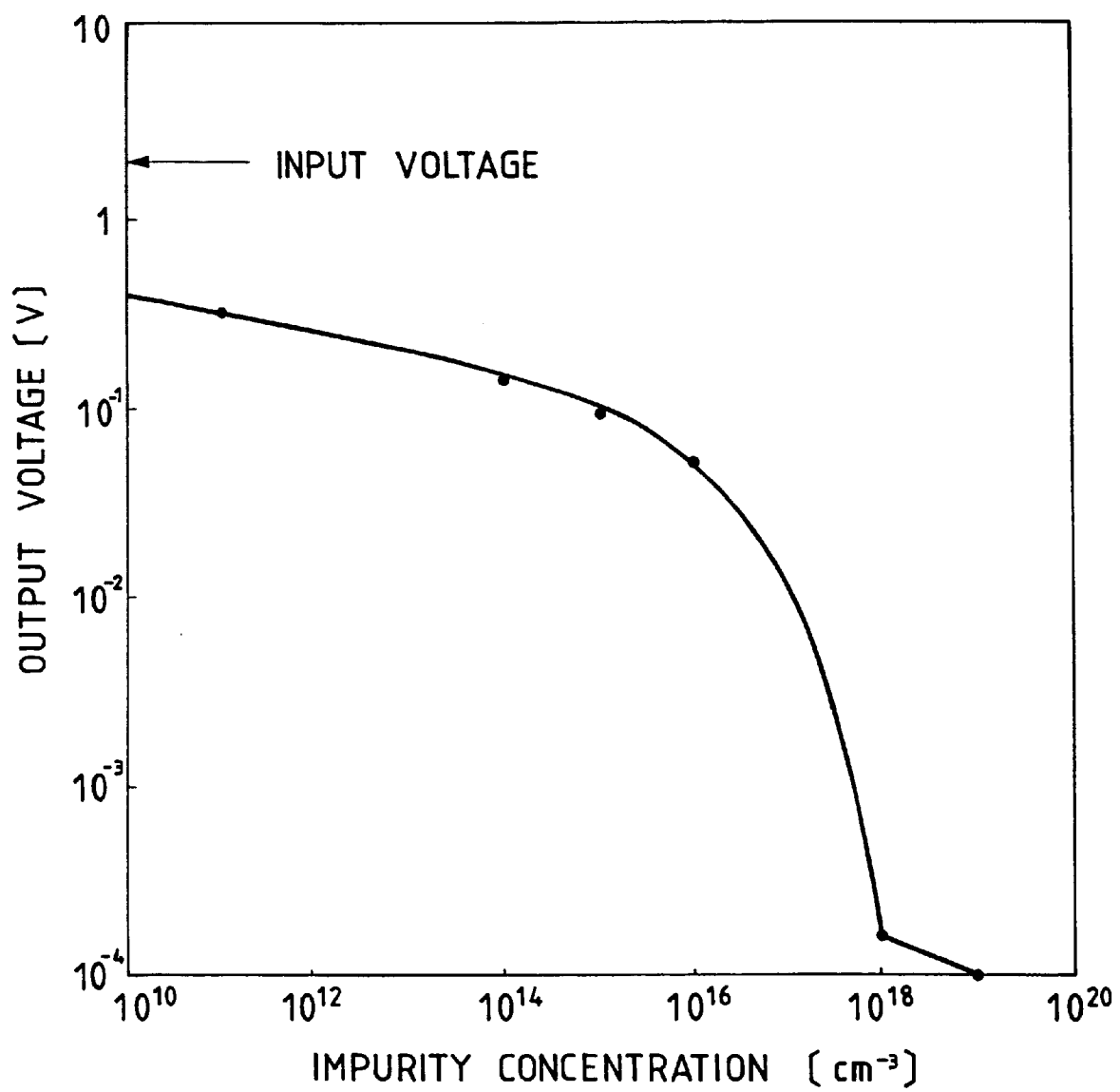
FIG. 6 is a diagram of an experimentally-available relation between an impurity concentration and an output voltage in the semiconductor device of FIG. 5.

FIG. 6 shows the measured values of the output voltage which are plotted as a function of the impurity concentration of the P silicon substrate 31. With reference to FIG. 6, the output voltage dropped abruptly as the impurity concentration increased from a value of $1 \times 10^{16}$ cm$^{-3}$. The drop in the output voltage started to be saturated when the impurity concentration reached a value of $1 \times 10^{18}$ cm$^{-3}$.

As will be made clear later, the grounded P silicon substrate 31 causes an output voltage lower than that available in the case using a floating P silicon substrate. Therefore, it is preferable to ground the P silicon substrate 31 rather than set the latter in a floating state.

To make the ratio of the output voltage to the input voltage equal to 1/1,000 or less, the impurity concentration of the P silicon substrate 31 is preferably equal to $1 \times 10^{18}$ cm$^{-3}$ or higher. With reference to a known relation between an impurity concentration and a resistivity (a specific resistance), the resistivity of the P silicon substrate 31 is preferably equal to $4 \times 10^{12}$ Ωcm or lower.

Third Embodiment

Figure 7:
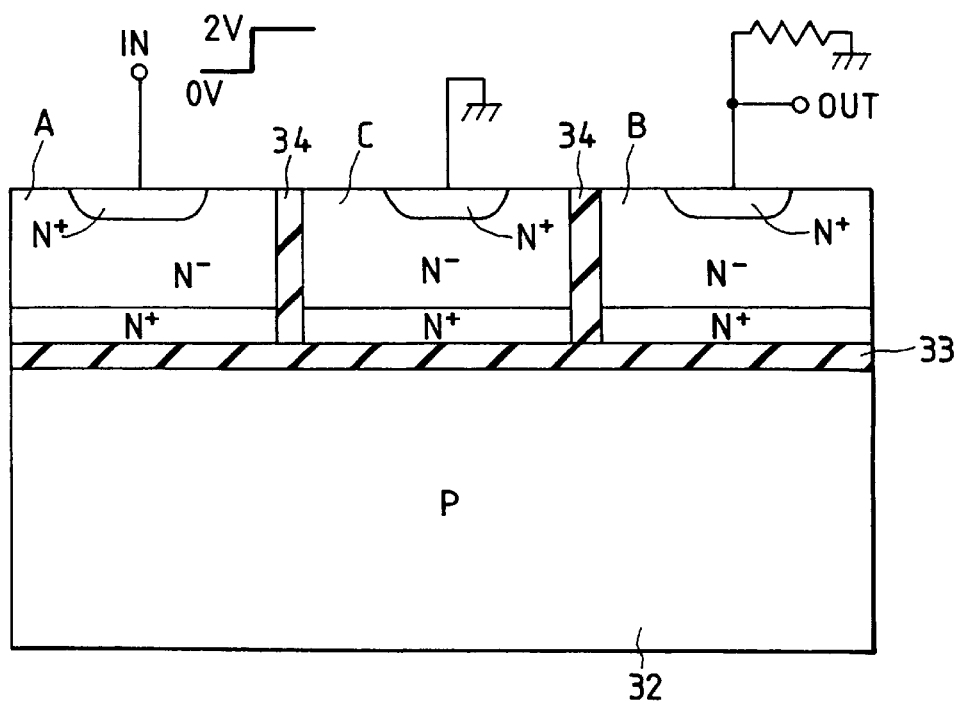
FIG. 7 is a sectional diagram of a semiconductor device according to a third embodiment of this invention.

FIG. 7 shows a semiconductor device basically similar to the semiconductor device of FIG. 1. The semiconductor device of FIG. 7 includes a P silicon substrate 32 on which a silicon dioxide film 33 extends. The P silicon substrate 32 and the silicon dioxide film 33 correspond to the P silicon substrate 3 and the silicon dioxide film 4 of FIG. 1 respectively.

In the semiconductor device of FIG. 7, island regions A, B, and C divided by trench regions (separation regions) 34 extend on the silicon dioxide film 33. The island regions A, B, and C are isolated from each other by the silicon dioxide film 33 and the trench regions 34. The island regions A, B, and C correspond to the island regions 15a, 15b, and 15c of FIG. 1 respectively. The trench regions 34 correspond to the separation regions 17 of FIG. 1.

During operation of the semiconductor device of FIG. 7, the island region C is grounded while the P silicon substrate 32 is set in a floating state. In other words, the island region C is subjected to a ground potential while the P silicon substrate 32 is floating.

Experiments were carried out as follows. Samples of the semiconductor device of FIG. 7 were prepared in which the P silicon substrates 32 had different impurity concentrations respectively. Regarding each of the samples, the island region C continued to be subjected to a ground potential while the P silicon substrate 32 was held in the floating state. In addition, an input voltage of 2 V was applied to the island region A. Regarding each of the samples, measurement was given of an output voltage which was induced at the island region B in response to the input voltage. Thus, measurement was given of the degree of the propagation of a voltage signal from the island region A to the island region B.

Figure 8:
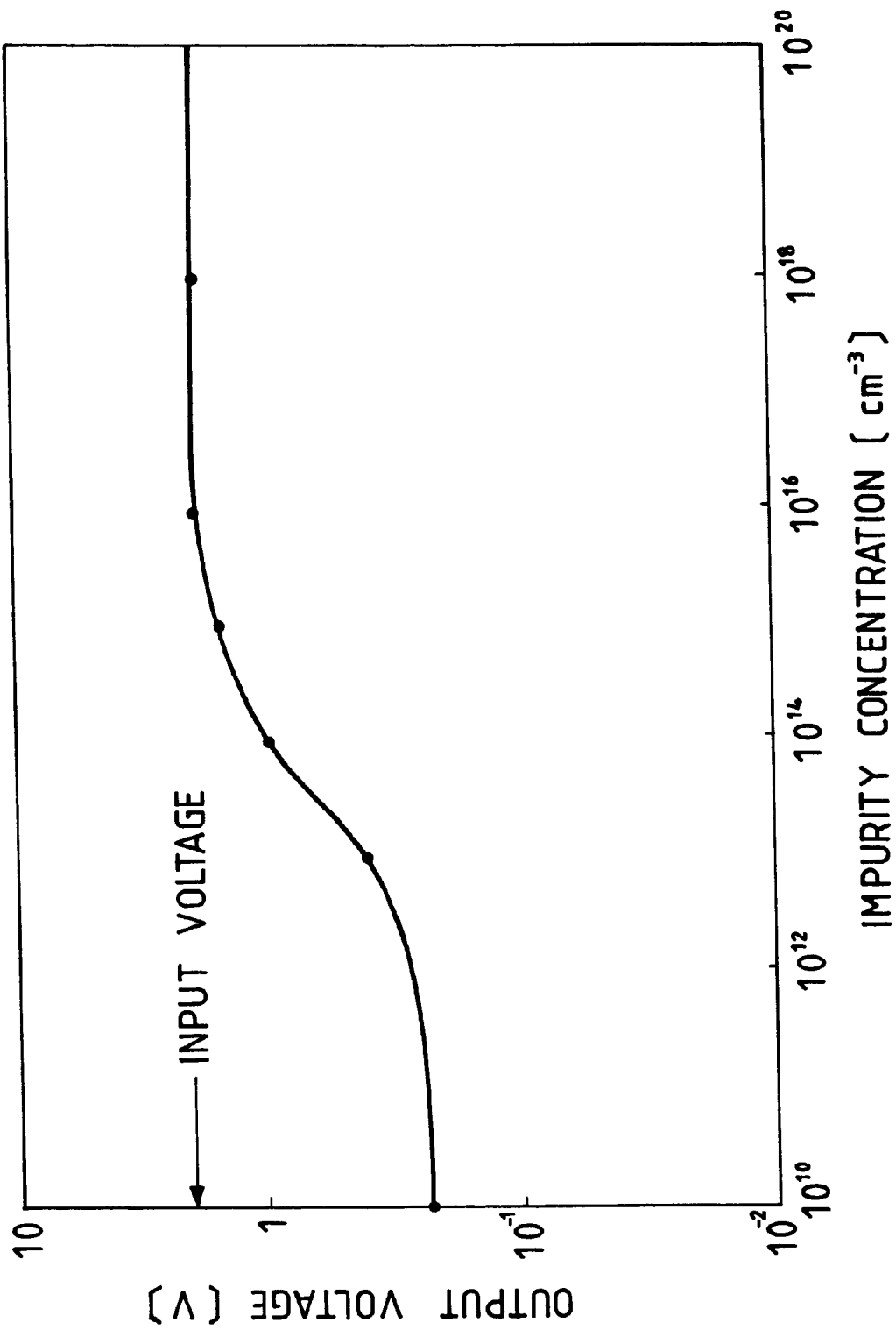
FIG. 8 is a diagram of an experimentally-available relation between an impurity concentration and an output voltage in the semiconductor device of FIG. 7.

FIG. 8 shows the measured values of the output voltage which are plotted as a function of the impurity concentration of the P silicon substrate 32. With reference to FIG. 8, the output voltage gradually dropped as the impurity concentration decreased from a value of $1 \times 10^{15}$ cm$^{-3}$. The output voltage further dropped as the impurity concentration decreased from a value of $1 \times 10^{14}$ cm$^{-3}$. The drop in the output voltage started to be saturated when the impurity concentration reached a value of $1 \times 10^{13}$ cm$^{-3}$.

As understood from FIGS. 6 and 8, the output voltage available in the semiconductor device of FIG. 7 was greater than that in the semiconductor device of FIG. 5. Therefore, it is preferable to ground the P silicon substrate rather than set the latter in the floating state.

To make the ratio of the output voltage to the input voltage equal to ¾ or less, the impurity concentration of the P silicon substrate 32 is preferably equal to $1 \times 10^{15}$ cm$^{-3}$ or lower. With reference to a known relation between an impurity concentration and a resistivity (a specific resistance), the resistivity of the P silicon substrate 32 is preferably equal to 15 Ωcm or higher. The impurity concentration of the P silicon substrate 32 is more preferably equal to $1 \times 10^{14}$ cm$^{-3}$ or lower. With reference to the known relation between the impurity concentration and the resistivity (the specific resistance), the resistivity of the P silicon substrate 32 is more preferably equal to $1.5 \times 10^2$ Ωcm or higher. This setting of the impurity concentration or the resistivity makes the ratio of the output voltage to the input voltage equal to ½ or less. The impurity concentration of the P silicon substrate 32 is most preferably equal to $1 \times 10^{13}$ cm$^{-3}$ or lower. With reference to the known relation between the impurity concentration and the resistivity (the specific resistance), the resistivity of the P silicon substrate 32 is most preferably equal to $1.5 \times 10^3$ Ωcm or higher. This setting of the impurity concentration or the resistivity makes the ratio of the output voltage to the input voltage equal to ⅒ or less.

Fourth Embodiment

Figure 9:
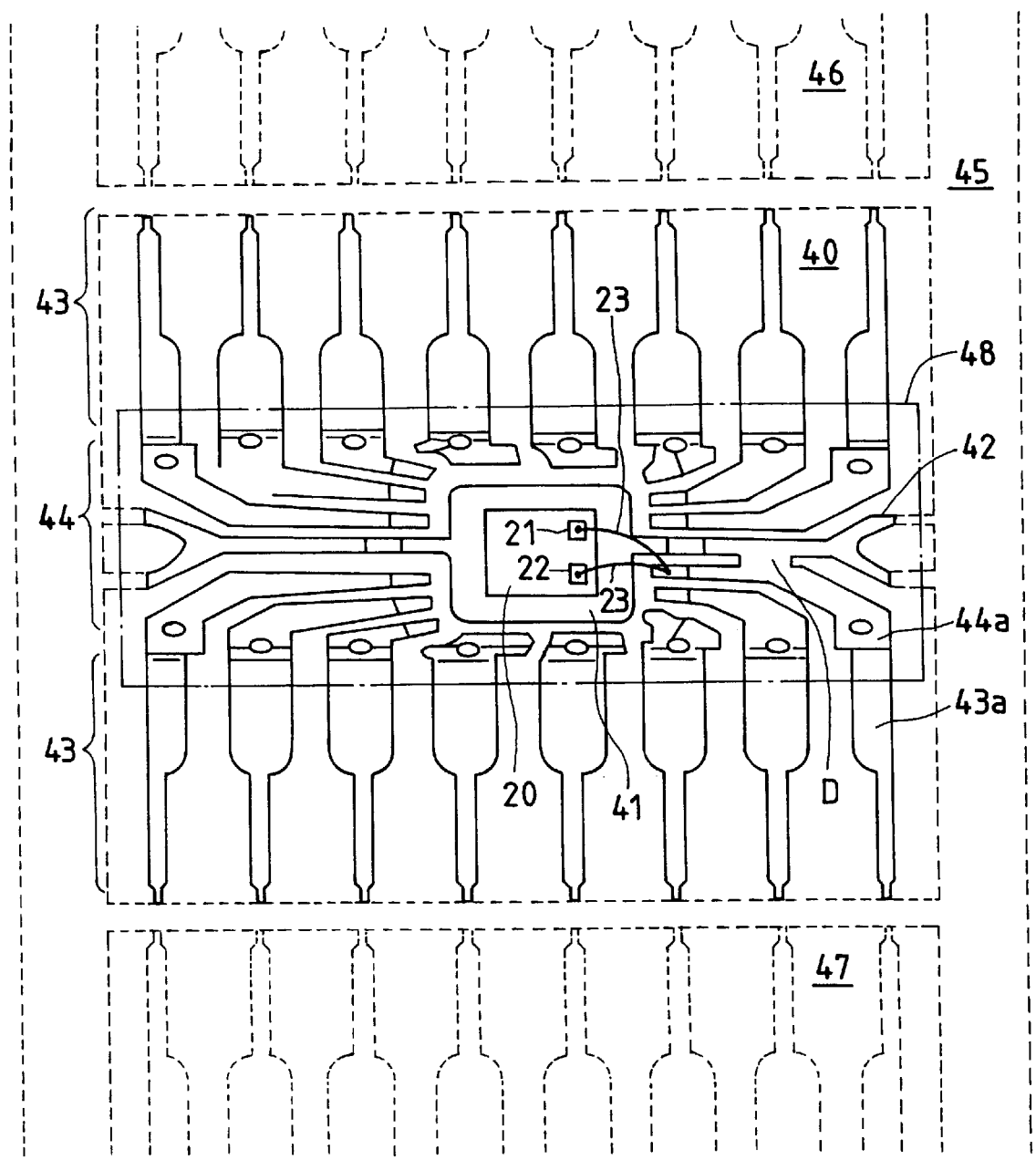
FIG. 9 is a top view of a Read frame according to a fourth embodiment of this invention.

With reference to FIG. 9, lead frames 40, 46, and 47 are integral with a guide (an outer frame) 45. The lead frame 40 includes an island 41 and lead terminals. The lead terminals have inner leads 44 and outer leads 43. The island 41 is supported or hung on the guide 45 by tab leads 42.

Semiconductor devices formed on a wafer are separated into semiconductor chips by dicing. A semiconductor chip 20 has a semiconductor device similar to the semiconductor device of FIG. 1. The semiconductor chip 20 is fixed to the island 41 by electrically conductive adhesive such as silver paste. Then, wire bonding is executed to provide electrical connection between the semiconductor chip 20 and the lead terminals. Subsequently, the semiconductor chip 20 and portions of the lead terminals are packaged by molding material 48. The package and the associated outer leads 43 are separated from the guide 45, being made into a molded IC chip.

Grounding pads 21 and 22 are formed on the semiconductor chip 20. The grounding pad 21 is used for an electrical circuit. The grounding pad 21 is used for applying a ground potential to the island regions 15c of FIG. 1 (or the island regions C of FIGS. 5 and 7). The grounding pads 21 and 22 are electrically connected to an inner lead 44a of a grounding lead terminal by bonding wires 23.

As denoted by the character "D" in FIG. 9, the tab lead 42 which supports the island 41 is connected to the inner lead 44a of the grounding lead terminal. Therefore, the P silicon substrate 3 (see FIG. 1) in the semiconductor device is electrically connected to the grounding lead terminal via the tab lead 42. Thus, the P silicon substrate 3 (see FIG. 1) can receive a ground potential via the inner lead 44a and the outer lead 43a of the grounding lead terminal.

The electrical connection of the island 41 to the grounding lead terminal (the inner leads 44a and the outer leads 43a) makes it possible to apply a ground potential to the P silicon substrate 3 (see FIG. 1) without increasing the number of terminals on the lead frame 40.

The whole of the back surface (the bottom or lower surface) of the P silicon substrate 3 (see FIG. 1), that is, the whole of the back surface of the semiconductor chip 20, is electrically connected to the island 41. This design enables the absorption of noise from areas directly below circuit elements in the semiconductor chip 20. Accordingly, it is possible to effectively prevent the propagation of noise between circuit elements in the semiconductor chip 20.

The connection between the tab lead 42 and the inner lead 44a is buried in the molding material 48. Therefore, the connection between the tab lead 42 and the inner lead 44a is protected by the molding material 48.

The back surface of the P silicon substrate 3 (see FIG. 1) is coated with an oxide film or the like during the fabrication of the semiconductor device. To provide good electrical connection between the semiconductor chip 20 and the island 41, it is preferable to remove such an oxide film from the P silicon substrate 3 (see FIG. 1) before the semiconductor chip 20 is placed on the island 41. The removal of the oxide film is executed simultaneously with the polishing process for decreasing the chip thickness. Accordingly, the oxide film can be removed from the back surface of the P silicon substrate 3 (see FIG. 1) without increasing the number of fabrication steps. To provide better ohmic contact between the semiconductor chip 20 and the island 41, it is preferable to form an electrode layer such as a gold-based layer on the back surface of the P silicon substrate 3 (see FIG. 1).

The P silicon substrate 3 (see FIG. 1) may be subjected to a power supply voltage or a given potential rather than the ground potential. In this case, a wire extending from a power supply pad or a given-potential pad is connected to the lead terminal including the inner lead 44a and the outer lead 43a.

What is claimed is:

1. A semiconductor device comprising:

a semiconductor substrate having a resistivity of no more than 1.5 Ωcm and having a main surface;

an insulating film formed on the main surface of the semiconductor substrate;

a semiconductor layer placed on the insulating film;

a plurality of side insulating regions extending from a surface of the semiconductor layer to the insulating film and dividing the semiconductor layer into a first element region, a second element region, and a third element region, the first element region, the second element region, and the third element region being isolated from each other by the plurality of side insulating regions and the insulating film and each of said first, second and third element regions being formed by said semiconductor layer, the second element region being located between the first element region and the third element region and exclusively forming a shield for preventing mutual interference between the first element region and the third element region;

means for applying and maintaining a fixed potential to the second element region; and means for applying the ground potential to the semiconductor substrate.

2. The semiconductor device according to claim 1, wherein:

the resistivity of the semiconductor substrate is equal to no more than $4 \times 10^{-2}$ Ωcm.

3. The semiconductor device according to claim 1, wherein:

the semiconductor substrate and the semiconductor layer are of different conduction types.

4. The semiconductor device according to claim 1, wherein:
the semiconductor substrate has an impurity concentration of at least $1 \times 10^{16}$ cm$^{-3}$.

5. The semiconductor device according to claim 1, wherein:
the semiconductor substrate has an impurity concentration of at least $1 \times 10^{18}$ cm$^{-3}$.

6. The semiconductor device according to claim 1, wherein:
the fixed potential applied to the second element region is a ground potential.

7. A semiconductor device comprising:
a semiconductor substrate having a resistivity of at least 15 Ωcm and having a main surface;
an insulating film formed on the main surface of the semiconductor substrate;
a semiconductor layer placed on the insulating film;
a plurality of side insulating regions extending from a surface of the semiconductor layer to the insulating film and dividing the semiconductor layer into a first element region, a second element region, and a third element region, the first element region, the second element region, and the third element region being isolated from each other by the plurality of side insulating regions and the insulating film and each of said first, second and third element regions being formed by said semiconductor layer, the second element region being located between the first element region and the third element region and exclusively forming a shield for preventing mutual interference between the first element region and the third element region; and
means for applying and maintaining a fixed potential to the second element region, the semiconductor substrate being electrically isolated from the ground potential.

8. The semiconductor device according to claim 7, wherein:
the resistivity of the semiconductor substrate is equal to at least $1.5 \times 10^2$ Ωcm.

9. The semiconductor device according to claim 7, wherein:
the resistivity of the semiconductor substrate is equal to at least $1.5 \times 10^3$ Ωcm.

10. The semiconductor device according to claim 7, wherein:
the semiconductor substrate has an impurity concentration of no more.

11. The semiconductor device according to claim 7, wherein:
the semiconductor substrate has an impurity concentration of no more than $1 \times 10^{13}$ cm$^{-3}$.

12. The semiconductor device according to claim 7, wherein:
the semiconductor device is of a flip chip type in face down connection.

13. The semiconductor device according to claim 7, wherein:
the fixed potential applied to the second element region is a ground potential.

14. A semiconductor device comprising:
a semiconductor chip comprising:
a supporting substrate having a resistivity of no more than 1.5 Ωcm,
an insulating layer,
an element-forming substrate,
a plurality of side insulating films, the plurality of side insulating films extending from a surface of the element-forming substrate to the insulating layer and dividing the element-forming substrate into a plurality of island regions, the plurality of island regions being isolated from each other by the plurality of side insulating films and the insulating layer and each being formed by said element-forming substrate;
the plurality of island regions comprising:
a first element-forming island region;
a second separating island region; and
a third element-forming island region;
said first element-forming island region and said third element-forming island region respectively including circuit elements;
the second separating island region separating the first element-forming island region from the third element-forming island region, and
the second separating island region being located between the first element-forming island region and the third element forming island region and exclusively forming a shield for preventing mutual interference between the first element-forming island region and the third element-forming island region;
means for applying and maintaining a fixed potential to the second separating island region,
means for applying the ground potential to the supporting substrate;
an electrically conductive lead frame comprising:
an island carrying the semiconductor chip,
a plurality of lead terminals separated from the island and connected to the semiconductor chip via bonding wires, the plurality of lead terminals comprising:
outer lead portions appearing to an exterior of a packaged device; and
inner lead portions concealed in the packaged device; and
a tab lead connected to the island and supporting the island in conjunction with the outer frame;
a whole of a surface of the supporting substrate opposite a surface contacting the insulating layer being connected to the island by electrically conductive adhesive;
the tab lead being connected to an inner lead portion of an adjacent one of the plurality of lead terminals;
a bonding wire extending from the separating island region and connected to the one of the plurality of lead terminals; and
the one of the plurality of lead terminals being subjectable to a given maintained voltage.

15. The semiconductor device according to claim 14, wherein:
the fixed potential applied to the second separating island region is a ground potential.

16. A semiconductor device comprising:
a semiconductor substrate having a resistivity of no more than 1.5 Ωcm and having a main surface;
an insulating film formed on the main surface of the semiconductor substrate;
a semiconductor layer placed on the insulating film;
a plurality of side insulating regions extending from a surface of the semiconductor layer to the insulating film and dividing the semiconductor layer into a first element region, a second element region, and a third element region, the first element region, the second element region, and the third element region being isolated from each other by the plurality of side insulating regions and the insulating film and each of said first, second and third element regions being formed by said semiconductor layer, the second element region being located between the first element region and the third element region and exclusively forming a shield for preventing mutual interference between the first element region and the third element region;

means for applying and maintaining a power supply voltage to the second element region; and means for applying the power supply voltage to the semiconductor substrate.

17. The semiconductor device according to claim 16, wherein:

the power supply voltage applied to the second element region is a fixed voltage.

18. A semiconductor device comprising:

a semiconductor chip comprising:
- a supporting substrate having a resistivity of no more than 1.5 Ωcm,
- an insulating layer,
- an element-forming substrate,
- a plurality of side insulating films extending from a surface of the element-forming substrate to the insulating layer and dividing the element-forming substrate into a plurality of island regions, the plurality of island regions being isolated from each other by the plurality of side insulating films and the insulating layer each of said plurality of island regions being formed by said element forming substrate;

the plurality of island regions comprising:
- a first element-forming island region;
- a second separating island region; and
- a third element-forming island region;

said first element-forming island region and said third element-forming island region respectively including circuit elements;

the second separating island region separating the first element-forming island region from the third element-forming island region, and the second separating island region being located between the first element-forming island region and the third element-forming island region and exclusively forming a shield for preventing mutual interference between the first element-forming island region and the third element-forming island region;

means for applying and maintaining a power supply voltage to the second separating island region, means for applying the power supply voltage potential to the supporting substrate;

an electrically conductive lead frame comprising:
- an island carrying the semiconductor chip,
- a plurality of lead terminals separated from the island and connected to the semiconductor chip via bonding wires, the plurality of lead terminals comprising:
  - outer lead portions appearing to an exterior of a packaged device; and
  - inner lead portions concealed in the packaged device; and
- a tab lead connected to the island and supporting the island in conjunction with the outer frame;

a whole of a surface of the supporting substrate opposite a surface contacting the insulating layer being connected to the island by electrically conductive adhesive;

the tab lead being connected to an inner lead portion of an adjacent one of the plurality of lead terminals;

a bonding wire extending from the separating island region and connected to the one of the plurality of lead terminals; and the one of the plurality of lead terminals being subjectable to a given maintained voltage.

19. The semiconductor device according to claim 18, wherein:

the power supply voltage applied to the second separating island 20 region is a fixed voltage.

* * * * *